United States Patent [19]

Seppala et al.

[11] Patent Number: 5,665,639
[45] Date of Patent: Sep. 9, 1997

[54] PROCESS FOR MANUFACTURING A SEMICONDUCTOR DEVICE BUMP ELECTRODE USING A RAPID THERMAL ANNEAL

[75] Inventors: Bryan R. Seppala; Todd G. Backer, both of Apple Valley; Lothar Maier, Eden Prairie, all of Minn.

[73] Assignee: Cypress Semiconductor Corp., San Jose, Calif.

[21] Appl. No.: 200,673

[22] Filed: Feb. 23, 1994

[51] Int. Cl.⁶ .................... H01L 21/283; H01L 21/58; H01L 21/60
[52] U.S. Cl. .................... 438/15; 228/180.22; 438/17; 438/614
[58] Field of Search .................... 437/183, 194, 437/174, 247; 228/180.22; 148/3, 4

[56] References Cited

U.S. PATENT DOCUMENTS

| | | | |
|---|---|---|---|
| 3,686,698 | 8/1972 | Akeyama et al. | 317/234 R |
| 3,719,981 | 3/1973 | Steitz | 29/423 |
| 3,859,723 | 1/1975 | Hamer et al. | 29/626 |
| 4,189,825 | 2/1980 | Robillard et al. | 29/574 |
| 4,600,600 | 7/1986 | Pammer et al. | |
| 4,732,874 | 3/1988 | Sparks. | |
| 4,742,023 | 5/1988 | Hasegawa | 437/183 |
| 4,764,248 | 8/1988 | Bhattacherjee et al. | |
| 4,851,358 | 7/1989 | Huber. | |
| 4,879,259 | 11/1989 | Reynolds et al. | |
| 4,880,708 | 11/1989 | Sharma et al. | 428/620 |
| 4,894,350 | 1/1990 | Zwicknagl et al. | |
| 4,948,754 | 8/1990 | Kondo et al. | 437/183 |
| 4,950,623 | 8/1990 | Dishon | 437/183 |
| 4,952,556 | 8/1990 | Mantese et al. | |
| 4,989,065 | 1/1991 | Tsuchimoto et al. | 357/67 |
| 5,017,508 | 5/1991 | Dodt et al. | |
| 5,059,553 | 10/1991 | Berndlmaier et al. | 437/183 |
| 5,100,835 | 3/1992 | Zheng. | |
| 5,108,950 | 4/1992 | Wakabuyashi et al. | 437/183 |
| 5,115,964 | 5/1992 | Ameen et al. | 228/180.2 |
| 5,137,845 | 8/1992 | Lochon et al. | 437/183 |
| 5,162,257 | 11/1992 | Yung | 437/183 |
| 5,173,449 | 12/1992 | Lorenzen et al. | 437/192 |
| 5,180,482 | 1/1993 | Abys et al. | |
| 5,186,383 | 2/1993 | Melton et al. | 228/180.2 |

(List continued on next page.)

FOREIGN PATENT DOCUMENTS

| | | |
|---|---|---|
| 56-105653 | 8/1981 | Japan. |
| 63-252447 | 10/1988 | Japan. |
| 63-289947 | 11/1988 | Japan. |
| 1-011350 | 1/1989 | Japan. |
| 271522 | 3/1990 | Japan. |
| 4-022131 | 1/1992 | Japan. |

OTHER PUBLICATIONS

Pecht, Michael, *Handbook of Electronic Package Design*, Marcel Dekker, Inc., pp. 187–192, 239–257 (1991).
Tummala, R.R. et al., *Microelectronics Packaging Handbook*, Van Nostrand Reinhold, pp. 409–435 (1989).

*Primary Examiner*—David Graybill
*Attorney, Agent, or Firm*—Blakely, Sokoloff, Taylor & Zafman, LLP

[57] ABSTRACT

A rapid thermal anneal (RTA) process minimizes the intermixing of materials between a bump and a bonding pad so as to provide for a more reliable and durable interconnect between the bump and the bonding pad and so as to allow the probing of wafers prior to bumping. A barrier layer is formed over the bonding pads of devices formed over a semiconductor substrate. Bumps are then formed over the bonding pads and are annealed for a short time at a high temperature so as to soften the bumps for later assembly in a semiconductor package. As a result of this quick annealing process, the intermixing of materials between the bumps and the bonding pads is minimized. This is so despite any decreased step coverage of the barrier layer over probe marks on the bonding pads which resulted from testing the wafer. Accordingly, wafers may now be tested prior to bumping, thus saving the cost, time, and process steps typically incurred in bumping wafers having a zero or low yield of properly functioning semiconductor devices.

27 Claims, 4 Drawing Sheets

U.S. PATENT DOCUMENTS

| | | | |
|---|---|---|---|
| 5,208,186 | 5/1993 | Mathew | 437/183 |
| 5,217,754 | 6/1993 | Santiago-Aviles et al. | |
| 5,233,504 | 8/1993 | Melton et al. | 361/760 |
| 5,244,833 | 9/1993 | Gansauge et al. | 437/183 |
| 5,249,732 | 10/1993 | Thomas | 228/179.1 |
| 5,250,466 | 10/1993 | Gerner et al. | 437/184 |
| 5,266,519 | 11/1993 | Iwamoto | 437/183 |
| 5,270,253 | 12/1993 | Arai et al. | 437/183 |
| 5,298,459 | 3/1994 | Arikawa et al. | 437/183 |
| 5,310,699 | 5/1994 | Chikawa et al. | 437/183 |
| 5,391,516 | 2/1995 | Wojnarowski et al. | 437/174 |
| 5,545,589 | 8/1996 | Tomura et al. | 437/183 |

5,665,639

PROCESS FOR MANUFACTURING A SEMICONDUCTOR DEVICE BUMP ELECTRODE USING A RAPID THERMAL ANNEAL

BACKGROUND OF THE INVENTION

1. Field of the Invention

The present invention relates generally to the field of semiconductor device fabrication, and more particularly to the field of bump processing for semiconductor device fabrication.

2. Description of the Related Art

Typically in semiconductor device fabrication, various semiconductor devices are formed over the surface of a semiconductor substrate in accordance with design and/or functional requirements for a desired semiconductor integrated circuit. Once these semiconductor devices have been formed, a passivation layer is put down over the surface of the wafer to seal the devices from contaminants and moisture and, generally, to protect the wafer from being damaged, for example, from scratching. This passivation layer is subsequently etched to expose specific metallization patterns, or "bonding pads," in the underlying device layers. These exposed bonding pads may later be connected to the lead frame of a chip carrier so as to provide for electrical connection to the device circuitry from outside the chip.

In order to establish these chip connections, "bumps" may be formed over the bonding pads. These bumps are typically formed prior to testing the device circuitry since the probing of the bonding pads used in such testing causes the material in the bonding pads to "roll up" and form probe marks on the surface of the bonding pads. Typically, these probe marks cannot be completely covered by a subsequently deposited barrier layer due to poor step coverage of this barrier layer over the probe marks. If a bump were to then be formed over the barrier layer of a given probed bonding pad and later annealed using typical annealing processes, excessive intermetallic elements would form between the bump and the probed bonding pad. Such excessive intermetallic formation would cause long term reliability problems since these intermetallic elements are brittle by nature, thus making the interface between the bump and the bonding pad fragile. Furthermore, Kirkendall voids would form at the interface of the bump and the probed bonding pad during the typical annealing process. This void formation would weaken the interface between the bump and the bonding pad and hence further reduce the reliability of the interconnect structure. As a consequence of typical bump annealing processes, then, the probing of wafers prior to bumping would prove to be ineffectual because of these long term reliability concerns.

One solution to avoid the above reliability problems is to test the semiconductor devices after the bonding pads have been bumped. That is, the probes used in testing the devices are directly or indirectly coupled to the bumps formed over the bonding pads as opposed to being coupled directly to the bonding pads prior to bumping. Without probe marks over the bonding pads, then, the overlying barrier layer has better step coverage over each bonding pad, thus preventing excessive intermetallic formation between the bump and the bonding pad during the bump annealing process. Although this process avoids the reliability problems caused when the bonding pads are directly probed during testing, it is more costly and wastes process steps. For example, if a wafer is bumped prior to testing and only later proves to have a zero or very low yield of properly functioning devices, most if not all of the cost, time, and processing incurred in bumping this low yield wafer has dearly been wasted. Had the wafer been tested prior to bumping, the discovery of its low yield would have prevented this waste.

Thus, what is needed is an improved process for bumping wafers to reduce or eliminate the intermixing of materials between the bonding pad and the bump when the bump is being annealed so as to provide for a more reliable and durable interconnection between the bump and the bonding pad. What if also needed is an improved process for probing wafers prior to bumping so that the cost, time, and processing efforts typically incurred in bumping wafers having a zero or low yield of properly functioning devices may be saved.

BRIEF SUMMARY OF THE INVENTION

The present invention advantageously improves typical bumping processes used for semiconductor device fabrication. More particularly, the present invention minimizes the intermixing of materials between a bonding pad and a bump when the bump is being annealed, thus providing for a more reliable and durable interconnection between the bump and the bonding pad. The present invention also allows for bumping probed wafers, thus saving the cost, time, and processing typically incurred in bumping wafers having a zero or low yield of properly functioning devices.

In accordance with the present invention, a semiconductor device having a bonding pad is formed over a semiconductor substrate. The bonding pad may contain aluminum. A passivation layer may be formed over the substrate and may then be patterned to expose at least a portion of the bonding pad. Once the bonding pad is exposed, it may be used to test the semiconductor device. For example, the bonding pad may be probed in testing the device. A barrier layer may be formed over the bonding pad. A bump is then formed over the bonding pad. This bump may contain gold. The bump is later annealed using a rapid thermal anneal (RTA) process. This RTA process may include the heating of the bump at a temperature of approximately 450 degrees Celsius for approximately 30 seconds. Once the bump has been annealed, the bump can be bonded in accordance with the packaging process of choice.

The present invention thus advantageously improves bump processing for semiconductor device fabrication since the quickness of the rapid thermal anneal process minimizes the intermixing of materials between the bump and the bonding pad, thus providing for a more reliable and durable interconnection between the bump and the bonding pad. Furthermore, semiconductor wafers may now be tested prior to bumping, thus saving the cost, time, and processing typically incurred in bumping wafers having a zero or low yield of properly functioning devices.

While the above advantages of the present invention have been described, other attendant advantages, objects, and uses of the present invention will become evident to one of ordinary skill in the art based on the following detailed description with reference to the accompanying drawings.

BRIEF DESCRIPTION OF THE DRAWINGS

The present invention is illustrated by way of example and not limitation in the figures of the accompanying drawings in which like references indicate similar elements and in which.

DETAILED DESCRIPTION

A preferred embodiment or embodiments in accordance with the present invention for bump processing for semiconductor device fabrication is described. In the following description, numerous specific details are set forth such as specific thicknesses, materials, processing sequences, deposition methods, etc., in order to provide a thorough understanding of the present invention. It will be evident, however, to one of ordinary skill in the art that the present invention may be practiced without these specific details. In other instances, well-known processing steps, equipment, etc., have not been described in particular detail so that the present invention is not unnecessarily obscured.

Figure 1:
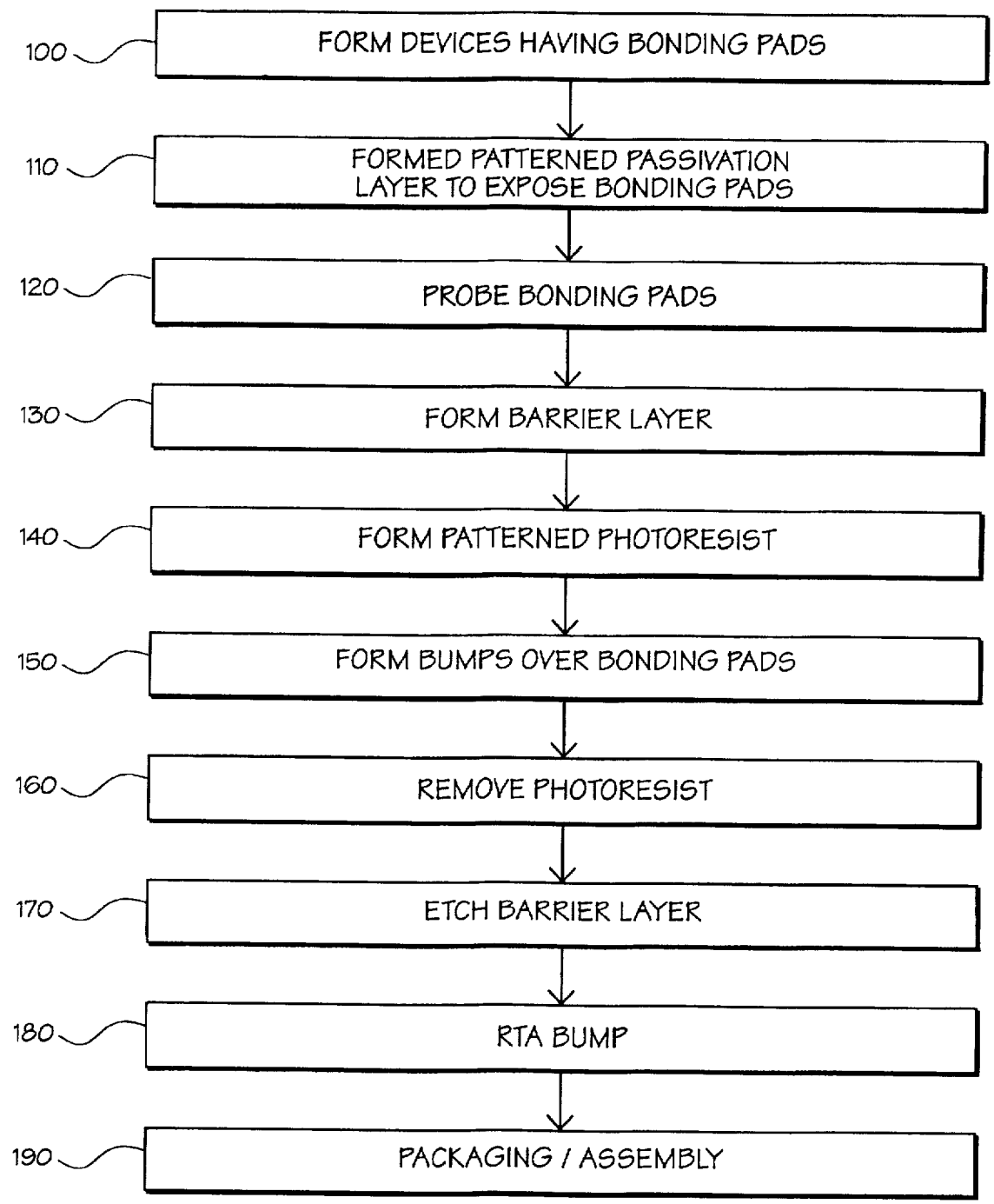
FIG. 1 illustrates, in the form of a flow diagram, an exemplary method for bump processing for semiconductor device fabrication in accordance with the present invention.

FIG. 1 illustrates, in the form of a flow diagram, an exemplary method for bump processing for semiconductor device fabrication in accordance with the present invention. So as to better explain the preferred embodiment or embodiments of the present invention, FIGS. 2 and 3a–3d will be used to illustrate the steps performed in the method of FIG. 1.

Figure 2:
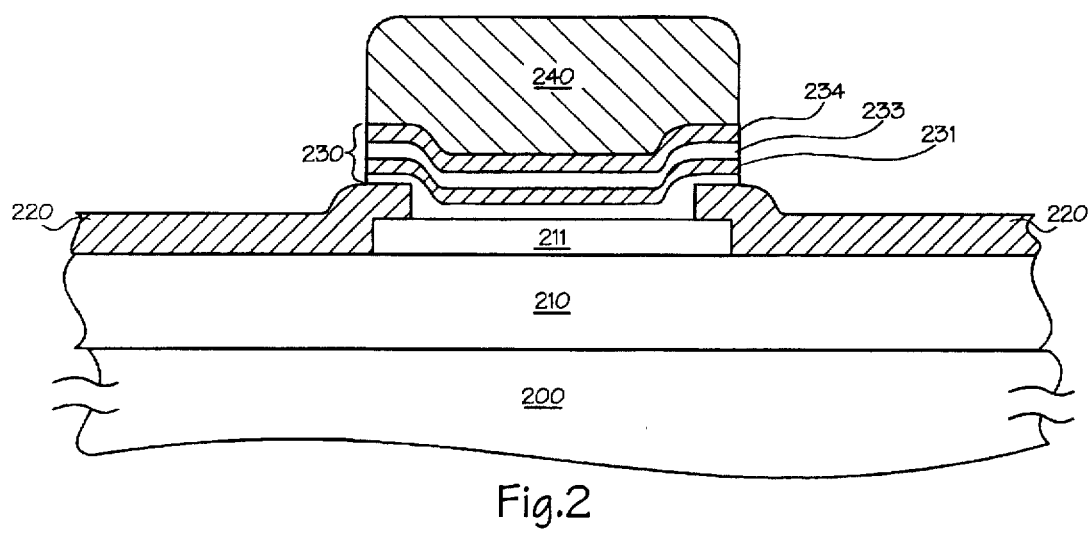
FIG. 2 illustrates a cross-sectional view of a portion of a semiconductor wafer having a bump formed in accordance with the present invention.

FIG. 2 illustrates a cross-sectional view of a portion of a semiconductor wafer having a bump formed over a substrate using the method of FIG. 1 in accordance with the present invention. In the semiconductor wafer formed in accordance with the present invention, semiconductor devices having bonding pads have been formed over a semiconductor substrate, as illustrated in FIG. 2 where device layers 210 and bonding pad 211 have been formed over semiconductor substrate 200. The semiconductor substrate may be, for example, a silicon substrate. The bonding pads may contain aluminum. A passivation layer has been formed over the devices and patterned so as to expose at least a portion of each bonding pad, as illustrated in FIG. 2 where patterned passivation layer 220 has been formed over device layers 210 and bonding pad 211 and has an opening exposing at least a portion of bonding pad 211. It is to be appreciated that the bonding pads may contain probe marks from probing of the bonding pads in testing the devices formed over the substrate.

A barrier layer has been formed over at least the exposed portion of each bonding pad, as illustrated in FIG. 2 where barrier layer 230 overlies at least a portion of bonding pad 211. In one preferred embodiment, the barrier layer contains four sublayers where a first sublayer overlies at least the exposed portion of the bonding pad and contains titanium tungsten (TiW), a second sublayer overlies the first sublayer and contains titanium tungsten nitride (TiWN), a third sublayer overlies the second sublayer and contains titanium tungsten (TiW), and a fourth sublayer overlies the third sublayer and contains gold (Au). The sublayers of the barrier layer are illustrated in FIG. 2 where barrier layer 230 contains sublayers 231, 232, 233, and 234 corresponding to the first, second, third, and fourth sublayers, respectively. Bumps have been formed over the barrier layer, as illustrated in FIG. 2 where bump 240 has been formed over barrier layer 230. These bumps may contain gold (Au). In accordance with the present invention, the bumps have been annealed using a rapid thermal anneal so as to soften the bumps for later packaging, for example, using a tape automated bonding (TAB) process. This rapid thermal anneal may include heating the bumps to a temperature of approximately 450 degrees Celsius (C) for approximately 30 seconds.

Figure 3A:
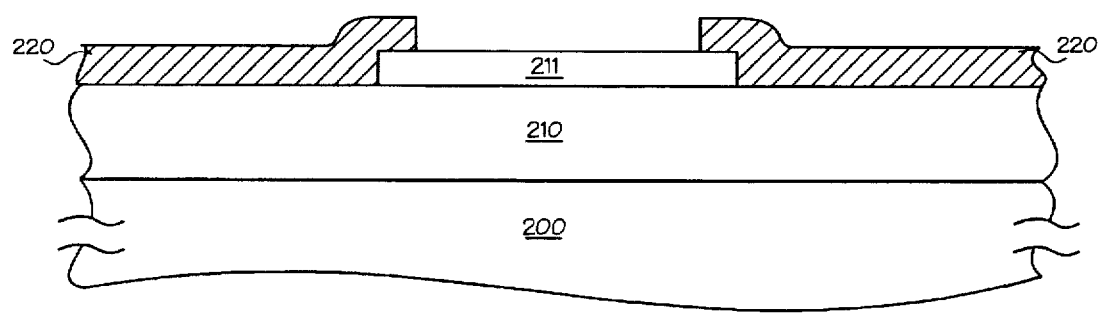
FIG. 3a illustrates a cross-sectional view of a portion of a semiconductor wafer where a patterned passivation layer exposes a portion of a bonding pad in accordance with the present invention.

For the processing of the semiconductor wafer partially illustrated in FIG. 2, a semiconductor substrate is provided, as illustrated in FIG. 3a by substrate 200. This substrate may be a silicon substrate, yet it is to be appreciated that a variety of other types of semiconductor substrates may be used, for example, depending upon one's specific design and/or functional requirements for the semiconductor device to be fabricated. Furthermore, while the description of the method used in fabricating the semiconductor wafer of FIG. 2 is illustrated as forming only one bump 240 over bonding pad 211 using substrate 200, it is to be understood that this depiction is merely illustrative for a clearer understanding of the present invention. It is to be understood that the views of FIGS. 2 and 3a–3d are merely partial views of a larger semiconductor substrate and that other bumps may be formed over other bonding pads using this same substrate. It is also to be understood that the present invention may be practiced in forming these other bumps and may also be practiced in forming only some of the other bumps formed over the substrate.

In Step 100 of FIG. 1, various devices having bonding pads are formed over a semiconductor substrate, as illustrated in FIG. 3a where device layers 210 and bonding pad 211 are formed over substrate 200. It is to be understood that the specific devices formed over the substrate may depend upon one's specific design and/or functional requirements for the semiconductor device to be fabricated. Step 100 may generally involve forming active device regions and field regions over the substrate and later forming a number of device layers of conductive and/or dielectric material, as illustrated in FIG. 3a where device layers 210 are formed over substrate 200, so as to form the devices. These device layers as well as underlying regions of the substrate may be interconnected by various conductive lines formed throughout the dielectric material of the device layers. Portions of these conductive lines may be used as bonding pads formed over the devices, as illustrated in FIG. 3a where bonding pad 211 overlies device layers 210, so as to provide external connections to the devices or substrate regions from outside the chip packaging which is to encapsulate the devices. These bonding pads may contain any number of suitable conductive materials, such as aluminum. For example, in one preferred embodiment, the bonding pads contain approximately 97 percent aluminum (Al), approximately two percent copper (Cu), and approximately one percent silicon (Si).

Once the device layers have been formed, a patterned passivation or overcoat layer containing a dielectric material is formed over the substrate in Step 110 of FIG. 1, as illustrated in FIG. 3a where patterned passivation layer 220 is formed over substrate 200. This passivation layer may serve to seal the devices in the device layers from contaminants and moisture and to protect the semiconductor wafer from being damaged, for example, from scratching. Any number of suitable processing methods and dielectric materials may be used to form this passivation layer. For example, the passivation layer may be formed by depositing a CVD silicon nitride ($Si_3N_4$) layer over the wafer followed by the deposition of a CVD silicon dioxide ($SiO_2$) layer over the silicon nitride layer. After the passivation layer has been formed, respective openings are patterned in this layer so as to expose at least a portion of the bonding pads, as illustrated in FIG. 3a where an opening in patterned passivation layer 220 exposes a portion of bonding pad 211.

In Step 120 of FIG. 1, then, the bonding pads, for example bonding pad 211 of FIG. 3a, may be probed in testing the semiconductor devices formed in Step 100 of FIG. 1. Here, probes are appropriately coupled to the bonding pads, which serve to provide for electrical contact to the underlying device circuitry, to test whether the devices formed over the substrate function as desired. While this probing of the bonding pads may prove to be very effective in determining whether the devices function properly and in determining the wafer's yield of properly functioning devices, such probing may cause the material in the bonding pads to "roll up" and form probe marks on the surface of the bonding pads. It is to be appreciated that these probe marks may not be completely covered by a subsequently deposited barrier layer due to poor step coverage of this barrier layer over the probe marks.

Figure 3B:
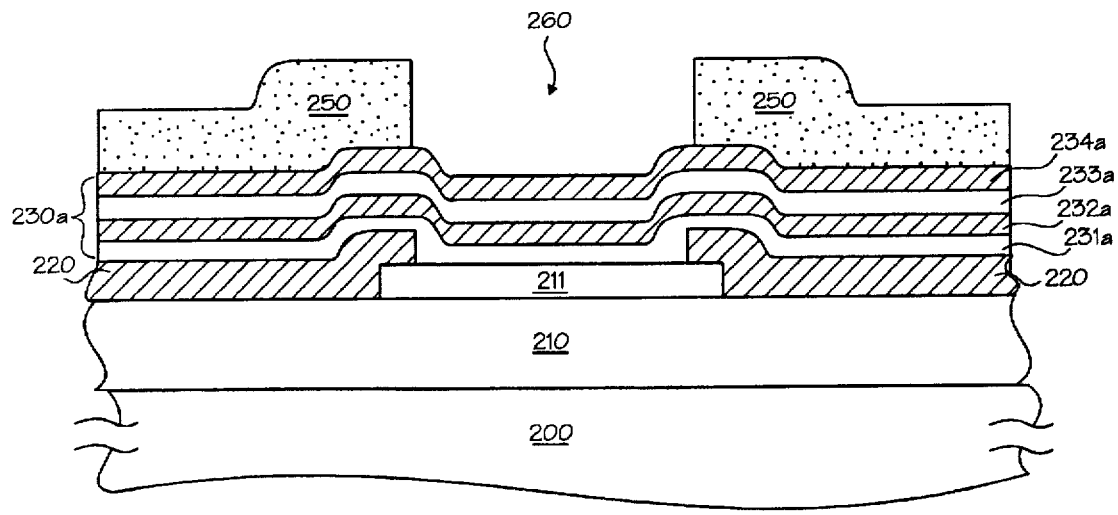
FIG. 3b illustrates the formation of a barrier layer and a patterned photoresist layer over the semiconductor wafer of FIG. 3a in accordance with the present invention.

In Step 150 of FIG. 1, then, a barrier layer is formed over the substrate, as illustrated in FIG. 3b where barrier layer 230a is formed over substrate 200 and overlies patterned passivation layer 220 and the exposed portion of bonding pad 211. This barrier layer may serve as a diffusion barrier to prevent or retard any intermixing of the bonding pad material with the material used for the bumps which will later be formed over the bonding pads. Such intermixing may occur, for example, when the wafer is subjected to various thermal treatments such as when the bumps are annealed or more generally whenever the bonding pads and bumps are exposed to extreme temperatures. Because of this intermixing, a brittle material may form at the interface of fie bonding pads and the bumps, thus making this interface fragile. This intermixing may also cause Kirkendall voids to form at this interface, thus weakening and further reducing the long-term reliability of the interconnection between the bumps and the bonding pads.

In order to form the barrier layer, any number of suitable processing methods and materials may be used to prevent or retard this intermixing while providing an electrical coupling between the bonding pads and the bumps. The material or materials used for the barrier layer may depend on the materials used for the bonding pads and for the bumps. Examples of such barrier layer materials include titanium (Ti), titanium tungsten (TiW), titanium tungsten nitride (TiWN), and chrome. It is to be appreciated here that when the bonding pads have been probed in testing the devices as discussed above, probe marks lie over the surface of the bonding pads. These probe marks may not be completely covered by the barrier layer which has poor step coverage over the probe marks as a result of its being sputter deposited over the bonding pads. This poor step coverage increases the likelihood of the bumps becoming exposed to and hence intermixed with the bonding pads when the bumps are annealed or when the wafer is exposed to elevated temperatures.

In a preferred embodiment where the bonding pads contain aluminum (Al) and the bumps contain gold (Au), the barrier layer contains four sublayers, as illustrated in FIG. 3b where barrier layer 230a contains sublayers 231a, 232a, 233a, and 234a. Here, a first sublayer is formed over the patterned passivation layer and over the exposed portions of the bonding pads by sputter deposition of approximately 500–1000 angstroms (Å) and preferable approximately 500 Å in thickness of titanium tungsten (TiW), as illustrated in FIG. 3b where sublayer 231a is formed over patterned passivation layer 220 and the exposed portion of bonding pad 211. The first sublayer may advantageously serve to provide better adhesion for a second sublayer to the surface of the wafer. The second sublayer is then formed over the first sublayer by sputter deposition of approximately 3000 Å–6000 Å and preferably approximately 6000 Å in thickness of titanium tungsten nitride (TiWN), as illustrated in FIG. 3b where sublayer 232a is formed over sublayer 231a. The second sublayer may advantageously serve as the actual barrier to prevent or retard any intermixing of the aluminum in the bonding pads with the gold in the bumps which will later be formed over the bonding pads. A third sublayer is then formed over the second sublayer by sputter deposition of approximately 500 Å–1500 Å and preferably approximately 750 Å in thickness of TiW, as illustrated in FIG. 3b where sublayer 233a is formed over sublayer 232a. The third sublayer may advantageously serve to provide better adhesion for a fourth sublayer to the second sublayer. Lastly, the fourth sublayer is formed over the third sublayer by sputter deposition of approximately 1500 Å–2500 Å and preferably approximately 2500 Å in thickness of gold (Au), as illustrated in FIG. 3b where sublayer 234a is formed over sublayer 233a. The fourth sublayer may advantageously serve as a plating interconnect to make the subsequent formation of bumps containing, for example, gold over the first three sublayers easier. While the above description of the barrier layer in a preferred embodiment describes the barrier layer as having two adhesion sublayers, a plating interconnect sublayer, as well as the actual barrier sublayer, the term barrier layer as used in this description is not to be construed as requiring such adhesion and plating interconnect sublayers, and any suitable layer or layers may serve as a barrier layer, depending upon the specific application. Furthermore, it will be appreciated that the deposition methods and thickness of the layers in the above described embodiment are merely illustrative, and any appropriate deposition method and thickness may be used.

Steps 140–160 of FIG. 1 illustrate the formation of the bump according to a currently preferred embodiment. While this preferred embodiment is described herein, it will be understood that any bump process can be used to form the bump. In Step 140 of FIG. 1, then, a patterned photoresist layer having respective openings over the bonding pads is formed over the wafer, as illustrated in FIG. 3b where patterned photoresist layer 250 is formed over barrier layer 230a and has opening 260 over at least a portion of bonding pad 211. Here, since any hydration in the wafer may deter the adhesion of photoresist to the wafer, the wafer may first be subjected to a dehydration bake at approximately 150 degrees Celsius (C) for approximately 30 minutes so as to remove hydration from the wafer. In order to further improve the adhesion qualities of the wafer to the photoresist, the wafer may then be primed with a pre-resist coating of hexamethyldisilazane (HMDS). Approximately 30 microns (μm) in thickness of photoresist is then coated over the wafer. In coating the photoresist, approximately 15 μm in thickness of photoresist is first coated over the wafer and subjected to a hot plate bake. Then, an additional thickness of approximately 15 μm of photoresist is coated over the wafer and also subjected to a hot plate bake. After this coating of photoresist, the wafer is subsequently baked at approximately 90 degrees C for approximately 30 minutes. It is to be understood that other photoresist thicknesses and other methods for forming photoresist over the wafer may be used. Preferably, however, the thickness of this photoresist is as thick if not thicker than the thickness of the bumps to be later formed for reasons which will follow. The coated photoresist is then exposed through a mask to approximately 40 milliWatts (mW) of ultra-violet radiation for approximately 40 seconds, and subsequently developed for approximately 90 seconds to create the patterned photoresist layer having respective openings over at least a portion of the bonding pads. Lastly, the resulting patterned photoresist layer is subjected to an oxygen plasma descum process for approximately 6.1 minutes in order to remove photoresist from unwanted areas over the wafer. It is to be understood that other methods of forming the patterned photoresist layer may be used so long as the resulting patterned photoresist layer has respective openings over at least a portion of the bonding pads. Furthermore, it is to be appreciated that while photoresist is used in a preferred embodiment, other materials such as a photosensitive polyimide or a dry film resist may be used in place of photoresist.

Figure 3C:
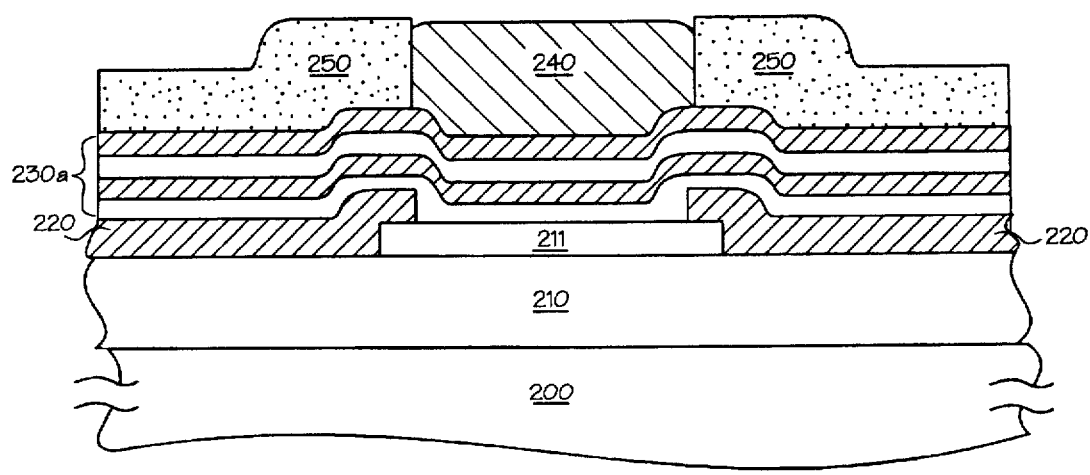
FIG. 3c illustrates the formation of a bump over the barrier layer covering a portion of the bonding pad of the semiconductor wafer of FIG. 3b in accordance with the present invention.

After having patterned the photoresist, bumps may now be formed over the bonding pads in Step 150 of FIG. 1, as illustrated in FIG. 3c where bump 240 has been formed in opening 260 over bonding pad 211. In forming the bumps, any number of suitable processing methods and materials may be used to provide an electrical coupling to the underlying bonding pads. Such suitable processing methods may or may not need the patterned photoresist layer in forming the bumps. In a preferred embodiment the bumps contain gold (Au) where approximately 25 microns (μm) in thickness of Au is plated in each of the openings of the patterned photoresist layer. As noted above, the thickness of the photoresist is preferably as great as if not greater than the desired thickness of the bumps to prevent the bump material from flowing over the top of the patterned photoresist layer. Such overflowing would create mushroom-shaped bumps and introduce the risk of creating shorts in the underlying device circuitry as a result of two or more bumps overflowing into one another. While this risk could be avoided by placing the bonding pads farther apart from one another, such a solution may limit how dense the wafer may be fabricated. It is thus preferable to avoid any such overflowing so that the density of the wafer is not limited by the bumping process.

In plating the bumps comprising gold in a preferred embodiment, the wafer may first be subjected to a surfactant dip to wet the surface of the wafer in the openings of the patterned photoresist layer so that air bubbles are not trapped in these openings as these air bubbles may prevent gold from later being properly deposited. The wafer is then subjected to a gold electroplating bath using a pulse plate such that bumps containing gold form over the barrier layer in each opening of the patterned photoresist layer. In this connection, the barrier layer's fourth sublayer which contains gold facilitates this gold plating process. Without this gold interconnect layer, the underlying TiW would be difficult to activate in the plating process, would have to be pre-cleaned, and could cause plated gold adhesion problems and/or resist lifting. In a preferred embodiment a rack plating method is used. Alternatively, fountain plating may be used to plate the gold. It is to be appreciated that other suitable methods of forming bumps comprising gold may be used. For example, a straight DC plating or a pulse and periodic reverse plating may be used to plate the bumps containing gold.

Figure 3D:
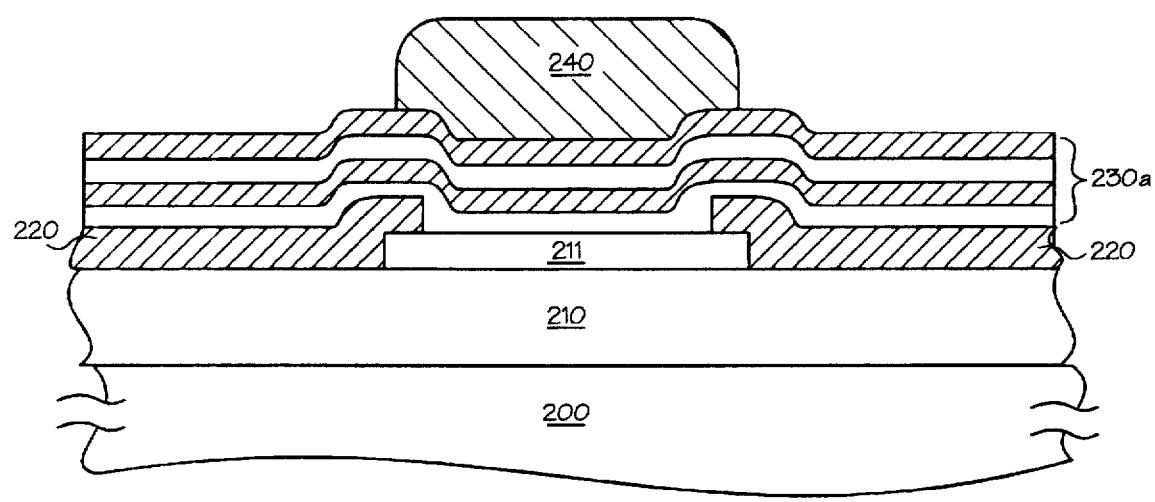
FIG. 3d illustrates the removal of the photoresist from the semiconductor wafer of FIG. 3c in accordance with the present invention.

Following the formation of bumps over the bonding pads, the patterned photoresist layer is removed from the wafer in Step 160 of FIG. 1, as illustrated in FIG. 3d where patterned photoresist layer 250 has been removed. Any number of suitable methods may be used so long as the preferred photoresist layer is removed. For example, a solvent resist strip may be used in removing the patterned photoresist layer here.

Following this photoresist removal, the barrier layer is etched in Step 170 of FIG. 1 so as to remove portions of the barrier layer which do not lie between the bumps and the bonding pads, as illustrated in FIG. 2 where barrier layer 230a has been etched. As a result, a barrier layer remains between each of the bumps and each of the bonding pads, as illustrated in FIG. 2 where barrier layer 230 lies between bump 240 and bonding pad 211. It is to be understood that any suitable etching technique may be used here depending, for example, on the material or materials used to form the barrier layer.

In a preferred embodiment the barrier layer between the bumps and the bonding pads is made up of four sublayers containing TiW, TiWN, TiW, and Au, respectively, as illustrated in FIG. 2 where barrier layer 230 contains sublayers 231, 232, 233, and 234 as a result of etching sublayers 231a, 232a, 233a, and 234a, respectively. In etching the barrier layer in this embodiment, a potassium iodine (KI) gold (Au) etch may be used for approximately three minutes to remove exposed portions of the fourth sublayer from the surface of the wafer. Following the etch of this gold sublayer, a tungsten (W) etch may be used with an ammonium fluoride chemistry for approximately 23.5 minutes in order to remove exposed portions of the first, second, and third sublayers from the surface of the wafer. It is to be appreciated that while this first etch may remove a small amount of gold from each of the bumps, very little gold is removed from the bumps during the second etch.

Now that the bumps have been formed over the bonding pads of the wafer, the bumps are subjected to a rapid thermal anneal (RTA) in Step 180 of FIG. 1. In general, an anneal is a process step which comprises a heat treatment used to reduce hardness, facilitate cold working, produce a desired microstructure, or obtain desired mechanical, physical, or other properties of a material, typically a metal. In the present invention, this annealing may be performed so as to soften the bumps for later bonding. In performing this rapid thermal anneal, the bumps are heated at a very high temperature for a relatively short period of time. Preferably, this time period is minimized to avoid or minimize any intermixing of materials between the bonding pads and the bumps. In doing so, the area surrounding the bumps may be radiated with energy having such a high energy pulse that a very rapid reaction occurs so as to anneal the material used for the bumps. The temperature and time of heating may depend upon the material used to form the bumps and may depend on the desired amount of reduction in hardness of the bump material. It is to be appreciated that because of the relatively short annealing time, the intermixing of materials between the bumps and the bonding pads is minimized while the bump is being annealed. This is so, despite any inability of the barrier layer to completely cover probe marks on the bonding pads. It is also to be appreciated that any suitable annealing method and equipment may be used to anneal the bumps so long as the intermixing of materials between the bumps and the bonding pads is minimized, and the bumps are sufficiently softened. In the present invention, the RTA process described below effectively accomplishes these objectives.

In a currently preferred embodiment, the "HEATPULSE 610" rapid thermal processing system, available from AG Associates is used to anneal the wafers. Temperature control is maintained using a bare silicon wafer having a K type thermocouple embedded in it. This thermocouple is used because the pyrometer typically used for temperature control in the "HEATPULSE 610" system is unable to detect temperatures below 600° C. This system heats the wafers using top and bottom high intensity heat lamps. In the present invention, only the bottom lamps are used to heat the wafer. It has been found that use of both sets of lamps results in excessive temperatures at the wafer surface, causing the aluminum metallization to bubble. In a preferred embodiment, the recipe used to process the wafer comprises five steps. The first step is a 30 second purge in the flow of forming gas (90% Ar, 10% $H_2$) at a flow rate of 6.0 standard liters per minute (slpm). The next step comprises a five second purge in 2.0 slpm forming gas. Next, the temperature is ramped to 450° C. at the rate of 20° C. per second, in a flow of 2.0 slpm forming gas. Next, the wafers are annealed at 450° C. for 30 seconds in 2.0 slpm forming gas. Finally, a cool down step is performed for 30 seconds in a forming gas ambient at a flow rate of 6.0 slpm. It will be appreciated that many different recipes and parameters may be used to achieve the objects of the present invention. For example, not all of the above described steps need necessarily be performed. Additionally, for example, any of these steps may be performed at different flow rates, utilizing different gases, different temperatures, and different temperature ramp rates from those disclosed herein. As described above, the steady state anneal is carried out at 450° C. for 30 seconds. As noted above, the gold bump is sufficiently softened to facilitate later bonding. As an example, the bumps comprising gold may a have hardness in the range of approximately 95 Vickers to approximately 105 Vickers after formation. Using the rapid thermal anneal process in accordance with the present invention, these bumps may be softened to a hardness in the range of approximately 40 Vickers to approximately 50 Vickers to facilitate later assembly. It will be appreciated that other anneal times and temperatures may be used, depending upon the specific requirements and materials. Typically, the temperature of the anneal will be in the range of approximately 250° C.–500° C. for a period in the range of approximately 15 seconds–60 seconds. Preferably, the anneal is carried out at a temperature in the range of approximately 350° C.–50° C. More preferably, the anneal is carried out at a temperature in the range of approximately 425° C.–475° C. for a period of time in the range of approximately 20 seconds–40 seconds. In general, the time and temperature of the anneal must not allow for excessive intermixing of the various metallic compounds, while still providing for sufficient softening to facilitate later assembly.

Since the rapid thermal anneal of the bumps minimizes the intermixing of materials between the bumps and the bonding pads, a more reliable and durable interconnection between the bumps and the bonding pads is ensured. Furthermore, since the bonding pads may be probed prior to bumping without risk of any excessive intermixing of materials between the bumps and the bonding pads when the bumps are subjected to this rapid thermal anneal, the cost, time, and processing typically incurred in bumping wafers having a zero or low yield of properly functioning devices may now be saved.

Once the bumps have been subjected to a rapid thermal anneal, they may now be assembled to a semiconductor package so as to provide for electrical coupling to the devices from outside the chip. In a currently preferred embodiment, a tape automated bonding (TAB) may be used in Step 190 of FIG. 1. In TAB processing, the bumps formed over the wafer are bonded to leads of a patterned material formed on a tape using a thermocompression bonding. These TAB tape leads are joined to the bumps formed over the wafer through use of a thermode which applies the TAB tape leads to the bumps under pressure at an elevated temperature for a certain period of time. It is to be appreciated that all of the TAB tape leads are bonded to the bumps simultaneously in this bonding process. As discussed above, the bumps over the wafer have been softened so that the material in the bumps collapses during the assembly process, thus facilitating the bonding of the leads to the bumps. Furthermore, the softened material in the bumps may serve as a cushion to prevent damage to the wafer as a result of this thermocompression bonding. Indeed, such bonding may cause the passivation layer to crack if the bumps were to maintain their original hardness when formed.

In a preferred embodiment where the bumps are made of gold, and the devices are assembled using a TAB process, a polyimide tape containing a copper (Cu) metallization pattern having gold-plated leads is used. Because the leads are gold-plated, the bonding of these leads to the gold bumps is easier and provides for a more reliable and durable bond.

It is to appreciated that while in a preferred embodiment the bumps are bonded using thermocompression in a TAB process, other suitable assembly processes may be used to form an interconnect to the annealed bumps. For example, the bumps may be bonded using a wire bonding process, using a thermal sonic single point bonding process, or any other method.

The preferred embodiment or embodiments in accordance with the present invention has thus been described. The present invention thus advantageously improves bump processing for semiconductor device fabrication since the quickness of the rapid thermal anneal process minimizes the intermixing of materials between the bumps and the bonding pads, thus providing for a more reliable and durable interconnection between the bump and the bonding pad. Furthermore, semiconductor wafers may now be tested prior to bumping, thus saving the cost, time, and processing typically incurred in bumping wafers having a zero or low yield of properly functioning devices.

While the above description in forming bumping wafers has been described with reference to the specific method as illustrated in FIG. 1, it will be evident to one of ordinary skill in the art that other methods, materials, and processing sequences may be used to form a semiconductor device where device layers having a bonding pad are formed over a substrate, and where a bump is formed over at least a portion of the bonding pad.

Lastly, while the detailed description in accordance with the present invention has been described above with regard to the best mode and preferred embodiment or embodiments contemplated by the inventors, it is to be appreciated that the present invention is not limited to the above embodiment or embodiments and that various modifications may be made to the above embodiment or embodiments without departing from the broader spirit or scope of the present invention as defined in the following claims. The specific embodiment or embodiments are, accordingly, to be regarded in an illustrative rather than a restrictive sense.

What is claimed is:

1. A method for use in semiconductor device fabrication comprising the steps of:

(a) forming over a semiconductor substrate a semiconductor device having a bonding pad;

(b) forming over the semiconductor device a layer having an opening which exposes a portion of the bonding pad;

(c) forming a bump comprising gold over the exposed portion of the bonding pad; and (d) annealing the bump with a rapid thermal anneal.

2. The method of claim 1, further comprising the step of:

(e) forming an interconnection between the bump and a semiconductor package.

3. The method of claim 1, further comprising the step of probing the bonding pad to test the semiconductor device prior to the bump forming step (c).

4. The method of claim 1, further comprising the step of forming a barrier layer over the exposed portion of the bonding pad prior to the bump forming step (c).

5. The method of claim 4, wherein the barrier layer forming step comprises the steps of forming a first adhesion sublayer over at least the exposed portion of the bonding pad, forming a barrier sublayer over the first adhesion sublayer, and forming a second adhesion sublayer over the barrier sublayer.

6. The method of claim 1, wherein the bonding pad comprises aluminum.

7. The method of claim 1, wherein the annealing step (d) comprises the step of heating the bump at a temperature between approximately 250 degrees Celsius and approximately 500 degrees Celsius for a period of time between approximately 15 seconds and approximately 60 seconds.

8. The method of claim 7, wherein the temperature is between approximately 350 degrees Celsius and approximately 500 degrees Celsius.

9. The method of claim 8, wherein the temperature is between approximately 425 degrees Celsius and approximately 475 degrees Celsius and wherein the period of time is between approximately 20 seconds and approximately 40 seconds.

10. The method of claim 9, wherein the temperature is approximately 450 degrees Celsius and wherein the period of time is approximately 30 seconds.

11. A method for use in semiconductor device fabrication comprising the steps of:
   (a) forming over a semiconductor substrate a semiconductor device having a bonding pad;
   (b) forming over the semiconductor device a layer having an opening which exposes a portion of the bonding pad;
   (c) probing the bonding pad to test the semiconductor device;
   (d) forming, after the probing step (c), a bump comprising gold over the exposed portion of the probed bonding pad;
   (e) annealing the bump with a rapid thermal anneal; and
   (f) forming an interconnection between the bump and a semiconductor package.

12. The method of claim 11, wherein the forming step (f) includes the step of using a tape automated bonding process.

13. The method of claim 11, wherein the method further comprises a barrier layer forming step, wherein said barrier layer forming step comprises the steps of forming a first adhesion sublayer over the exposed portion of the bonding pad, forming a barrier sublayer over the first adhesion sublayer, and forming a second adhesion sublayer over the barrier sublayer.

14. The method of claim 11, wherein the annealing step (e) comprises the step of heating the bump at a temperature between approximately 250 degrees Celsius and approximately 500 degrees Celsius for a period of time between approximately 15 seconds and approximately 60 seconds.

15. The method of claim 14, wherein the temperature is between approximately 350 degrees Celsius and approximately 500 degrees Celsius.

16. The method of claim 15, wherein the temperature is between approximately 425 degrees Celsius and approximately 475 degrees Celsius and wherein the period of time is between approximately 20 seconds and approximately 40 seconds.

17. The method of claim 16, wherein the temperature is approximately 450 degrees Celsius and wherein the period of time is approximately 30 seconds.

18. The method of claim 2, wherein the forming step (e) includes the step of using a tape automated bonding process.

19. The method of claim 5, wherein the first adhesion sublayer comprises titanium tungsten (TiW), the barrier sublayer comprises titanium tungsten nitride (TiWN), and the second adhesion sublayer comprises titanium tungsten (TiW).

20. The method of claim 11, wherein the bonding pad comprises aluminum.

21. The method of claim 13, wherein the first adhesion sublayer comprises titanium tungsten (TiW), the barrier sublayer comprises titanium tungsten nitride (TiWN), and the second adhesion sublayer comprises titanium tungsten (TiW).

22. A method for use in semiconductor device fabrication comprising the steps of:
   (a) forming over a semiconductor substrate a semiconductor device having a bonding pad;
   (b) forming over the semiconductor device a passivation layer having an opening which exposes a portion of the bonding pad;
   (c) probing the bonding pad to test the semiconductor device;
   (d) forming, after the probing step (c), a barrier layer over the exposed portion of the probed bonding pad;
   (e) forming a bump comprising gold over the barrier layer;
   (f) annealing the bump with a rapid thermal anneal by heating the bump at a temperature between approximately 425 degrees Celsius and approximately 475 degrees Celsius for a period of time between approximately 20 seconds and approximately 40 seconds; and
   (g) forming an interconnection between the bump and a semiconductor package.

23. The method of claim 22, wherein the barrier layer forming step (d) comprises the steps of:
   (i) forming a first adhesion sublayer over the exposed portion of the probed bonding pad,
   (ii) forming a barrier sublayer over the first adhesion sublayer, and
   (iii) forming a second adhesion sublayer over the barrier sublayer.

24. The method of claim 23, wherein the bonding pad comprises aluminum (Al), the first adhesion sublayer comprises titanium tungsten (TiW), the barrier sublayer comprises titanium tungsten nitride (TiWN), and the second adhesion sublayer comprises titanium tungsten (TiW).

25. The method of claim 22, wherein the bump forming step (e) comprises the steps of:
   (i) forming over the barrier layer a patterned layer having an opening over the exposed portion of the bonding pad, and
   (ii) using a plating process to form in the opening of the patterned layer the bump comprising gold.

26. The method of claim 22, wherein the temperature is approximately 450 degrees Celsius and the period of time is approximately 30 seconds.

27. The method of claim 22, wherein the forming step (g) includes the step of using a tape automated bonding process.

* * * * *